United States Patent
Kuo et al.

(10) Patent No.: US 9,385,003 B1
(45) Date of Patent: Jul. 5, 2016

(54) RESIDUE FREE SYSTEMS AND METHODS FOR ISOTROPICALLY ETCHING SILICON IN TIGHT SPACES

(71) Applicant: Lam Research Corporation, Fremont, CA (US)

(72) Inventors: Ming-Shu Kuo, San Ramon, CA (US); Qinghua Zhong, Fremont, CA (US); Helene Del Puppo, Fremont, CA (US); Ganesh Upadhyaya, Pleasanton, CA (US); Gowri Kamarthy, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/623,144

(22) Filed: Feb. 16, 2015

(51) Int. Cl.
*H01L 21/302* (2006.01)
*H01L 21/3213* (2006.01)
*H01J 37/32* (2006.01)
*H01L 21/3205* (2006.01)

(52) U.S. Cl.
CPC ..... *H01L 21/32137* (2013.01); *H01J 37/32009* (2013.01); *H01J 37/32449* (2013.01); *H01J 37/32715* (2013.01); *H01L 21/32055* (2013.01)

(58) Field of Classification Search
CPC .......... H01L 21/32137; H01L 21/32055; H01L 37/32449; H01J 37/32009; H01J 37/32715
USPC .......... 438/719, 689, 694, 706, 710; 216/37, 216/67, 74, 79; 219/494
See application file for complete search history.

(56) References Cited

U.S. PATENT DOCUMENTS

| | | | |
|---|---|---|---|
| 6,184,158 B1 | 2/2001 | Shufflebotham et al. | |
| 6,835,919 B2 * | 12/2004 | Tolmachev | H01J 37/32357 156/345.37 |
| 7,977,249 B1 * | 7/2011 | Liu | H01L 21/31111 216/79 |
| 8,679,982 B2 * | 3/2014 | Wang | H01J 37/32357 216/37 |
| 2005/0028837 A1 * | 2/2005 | Nam | B08B 3/02 134/2 |
| 2013/0135058 A1 | 5/2013 | Long et al. | |

* cited by examiner

*Primary Examiner* — Duy Deo
*Assistant Examiner* — Maki Angadi

(57) ABSTRACT

Systems and methods for etching a substrate include arranging a substrate including a first structure and a dummy structure in a processing chamber. The first structure is made of a material selected from a group consisting of silicon dioxide and silicon nitride. The dummy structure is made of silicon. Carrier gas is supplied to the processing chamber. Nitrogen trifluoride and molecular hydrogen gas are supplied to the processing chamber. Plasma is generated in the processing chamber. The dummy structure is etched.

10 Claims, 4 Drawing Sheets

RESIDUE FREE SYSTEMS AND METHODS FOR ISOTROPICALLY ETCHING SILICON IN TIGHT SPACES

FIELD

The present disclosure relates to substrate processing systems, and more particularly to systems and methods for isotropically etching silicon in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit and etch film on substrates such as semiconductor wafers. During processing, dummy structures may be used during some processing steps and then later removed during subsequent processing steps. Pure silicon may be used for the dummy structures. For example only, silicon dummy structures may be used as dummy gates for high-k metal gate technology, mandrels for spacer formation and liners for back end of line (BEoL) air gaps.

The dummy silicon structures need to be removed without damaging other structures that need to remain on the substrate. As a result, the etch process to remove the silicon dummy structures should have infinite selectivity to silicon dioxide ($SiO_2$) and/or silicon nitride ($Si_3N_4$). Conventionally, wet etching is selected for its superior selectivity performance. However, wet etching may leave residue. As feature scaling continues, silicon residue removal in small spaces is becoming more challenging.

Molecular oxygen ($O_2$)-rich hydrogen bromide (HBr)/$O_2$ plasmas or silicon tetrachloride ($SiCl_4$)-additive plasmas may be used to remove dummy silicon when infinite selectivity to $SiO_2$ and/or $Si_3N_4$ is required. Due to excess byproduct ($SiOBr_x$ or $SiOCl_x$) deposition on the substrate, a diluted hydrofluoric (HF) acid dip is usually required after plasma treatment for post-etch wafer clean. However, the diluted HF acid wet clean process often leads to additional damage to the $SiO_2$ layer.

SUMMARY

A method for etching a substrate includes arranging a substrate including a first structure and a dummy structure in a processing chamber. The first structure is made of a material selected from a group consisting of silicon dioxide and silicon nitride. The dummy structure is made of silicon. The method includes supplying carrier gas to the processing chamber; supplying nitrogen trifluoride and molecular hydrogen gas to the processing chamber; striking plasma in the processing chamber; and etching the dummy structure.

In other features, the processing chamber is an inductively coupled plasma processing chamber. The dummy structure is covered by the material. The dummy structure is not covered by the material. The dummy structure is etched with infinite selectivity to the material. The dummy structure is etched with etch byproducts.

In other features, the method includes removing the etch byproducts using a solvent. The solvent includes water. The solvent includes a mixture of sulfuric acid and hydrogen peroxide. The dummy structure is etched isotropically.

A substrate processing system for etching a substrate includes a processing chamber. A substrate support is arranged in the processing chamber to support a substrate including a first structure and a dummy structure. The first structure is made of a material selected from a group consisting of silicon dioxide and silicon nitride. The dummy structure is made of silicon. A gas delivery system is configured to selectively supply process and carrier gas to the processing chamber. A plasma generator is configured to selectively supply plasma in the processing chamber. A controller is configured to selectively control the gas delivery system and the plasma generator. The controller is further configured to supply carrier gas to the processing chamber; supply nitrogen trifluoride and molecular hydrogen gas to the processing chamber; strike plasma in the processing chamber; and etch the dummy structure.

In other features, the processing chamber is an inductively coupled plasma processing chamber. The dummy structure is covered by the material. The dummy structure is not covered by the material. The controller is configured to etch the dummy structure with infinite selectivity to the material. The dummy structure is etched with etch byproducts. The dummy structure is etched isotropically.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to isotropic plasma etch processes that provide manageable residue and etch products with infinite Si-to-oxide and Si-to-$Si_3N_4$ selectivity. In some examples, the isotropic plasma etch process is used to remove silicon dummy structures used on substrates during processing. In some examples, the substrates further include $SiO_2$ or $Si_3N_4$ structures. The isotropic plasma etch process includes a nitrogen trifluoride $NF_3$/molecular hydrogen ($H_2$) plasma etch process for silicon etch. In some examples, an inductively coupled plasma (ICP) processing chamber is used.

For example only, isotropic etching of pure silicon under a hard mask layer or in uncovered areas may be performed. In this example, the isotropic etch process has infinite selectivity to $SiO_2$ with zero $SiO_2$ loss as measured by an optical instrument.

When using $NF_3$/$H_2$ plasma, some residue may remain in covered and uncovered areas. In some examples, the residue can be removed by water or sulfuric acid and hydrogen peroxide ($H_2SO_4/H_2O_2$ (piranha)). No additional damage is caused to $SiO_2$ or $Si_3N_4$ by these residue removal solvents.

While the foregoing example will be described in the context of an inductively coupled plasma processing (ICP) chamber, the etch process may be performed in other types of plasma processing chambers such as plasma-enhanced chemical vapor deposition (PECVD) processing chambers, remote plasma CVD (RPCVD) processing chambers, etc. In an inductively coupled plasma (ICP) process, energy is supplied by electric currents that are produced by electromagnetic induction (or time-varying magnetic fields). Generally, one or more inductive coils are arranged outside of a plasma processing chamber adjacent to a dielectric window and gas is supplied inside of the plasma processing chamber. RF power is supplied to the inductive coil and plasma is ignited in the ICP processing chamber.

While a specific example of an ICP processing chamber will be described below, other ICP processes may be used. Any ICP that is compatible with high vacuum pressure can be used. In addition to ICP, a remote plasma process may also be used for $NF_3/H_2$ isotropic etch.

Figure 1:
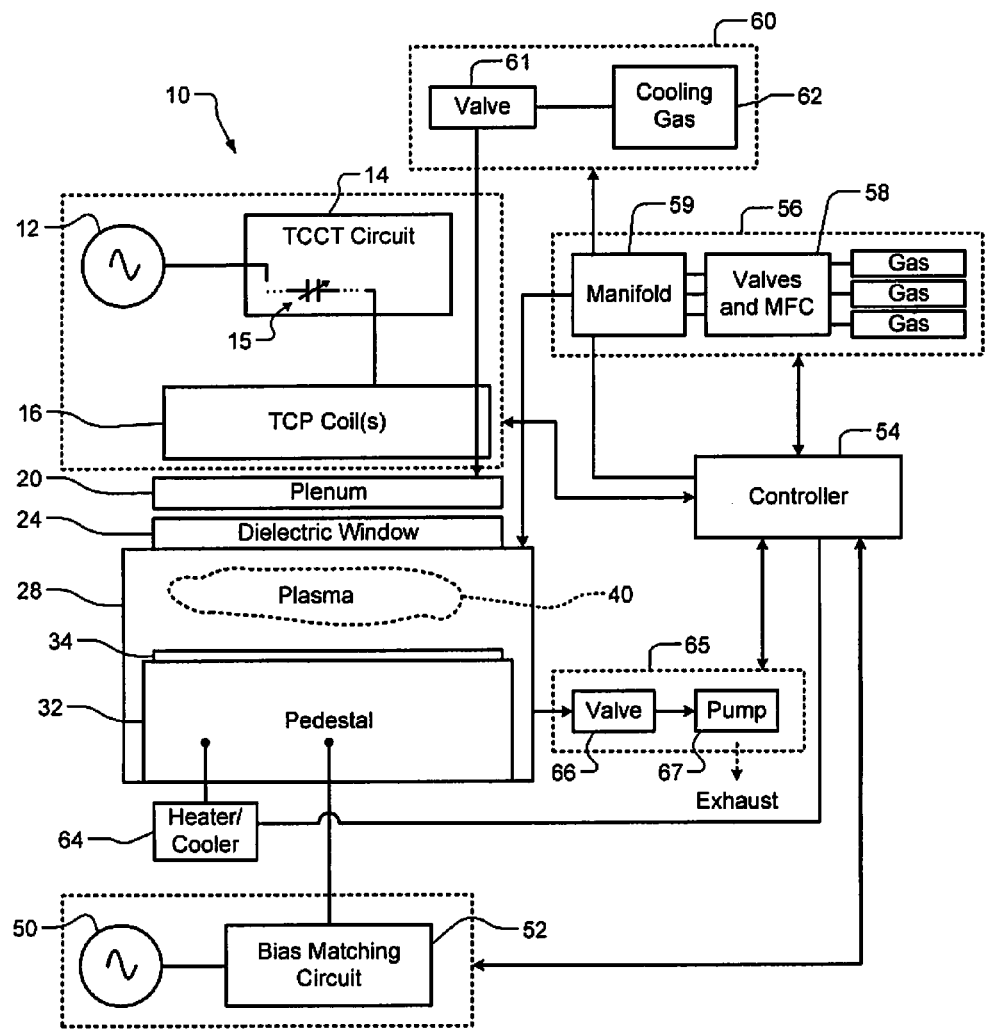
FIG. 1 is a functional block diagram of an example of a substrate processing system using inductivity coupled plasma (ICP)

Referring now to FIG. 1, an example of a substrate processing system 10 according to the present disclosure is shown. The substrate processing system 10 includes an RF source 12 connected to a transformer coupled capacitive tuning (TCCT) circuit 14, which is connected to TCP coils 16.

The TCCT circuit 14 typically includes one or more fixed or variable capacitors 15. An example of a TCCT circuit 14 is shown and described in commonly assigned U.S. Publication No. 2013/0135058 to Long et al., which is hereby incorporated by reference in its entirety. The TCP coils 16 may include a pair of coils or an inner coil pair and an outer coil pair.

A gas plenum 20 may be arranged between the TCP coils 16 and a dielectric window 24. The dielectric window 24 is arranged along one side of a processing chamber 28. The processing chamber 28 further comprises a pedestal 32 that supports a substrate 34. The pedestal 32 may include an electrostatic chuck, a mechanical chuck or other type of chuck. Plasma 40 is generated inside of the processing chamber 28. The plasma 40 etches the substrate 34. An RF source 50 and a bias matching circuit 52 may be used to bias the pedestal 32 during operation.

A gas delivery system 56 may be used to supply a gas mixture to the processing chamber 28 adjacent to the dielectric window 24. The gas delivery system 56 may include process gas sources 57, a metering system 58 such as valves and mass flow controllers, and a manifold 59.

A gas delivery system 60 may be used to deliver gas 62 via a valve 61 to the gas plenum 20. The gas may include cooling gas that is used to cool the TCP coils 16 and the dielectric window 24. A heater 64 may be used to heat the pedestal 32 to a predetermined temperature. An exhaust system 65 includes a valve 66 and pump 67 to remove reactants from the processing chamber 28 by purging or evacuation.

A controller 54 may be used to control the etching process. The controller 54 monitors process parameters such as temperature, pressure, etc. and controls delivery of the gas mixture, striking, maintaining and extinguishing the plasma, removal of reactants, supply of cooling gas, etc.

Figure 2:
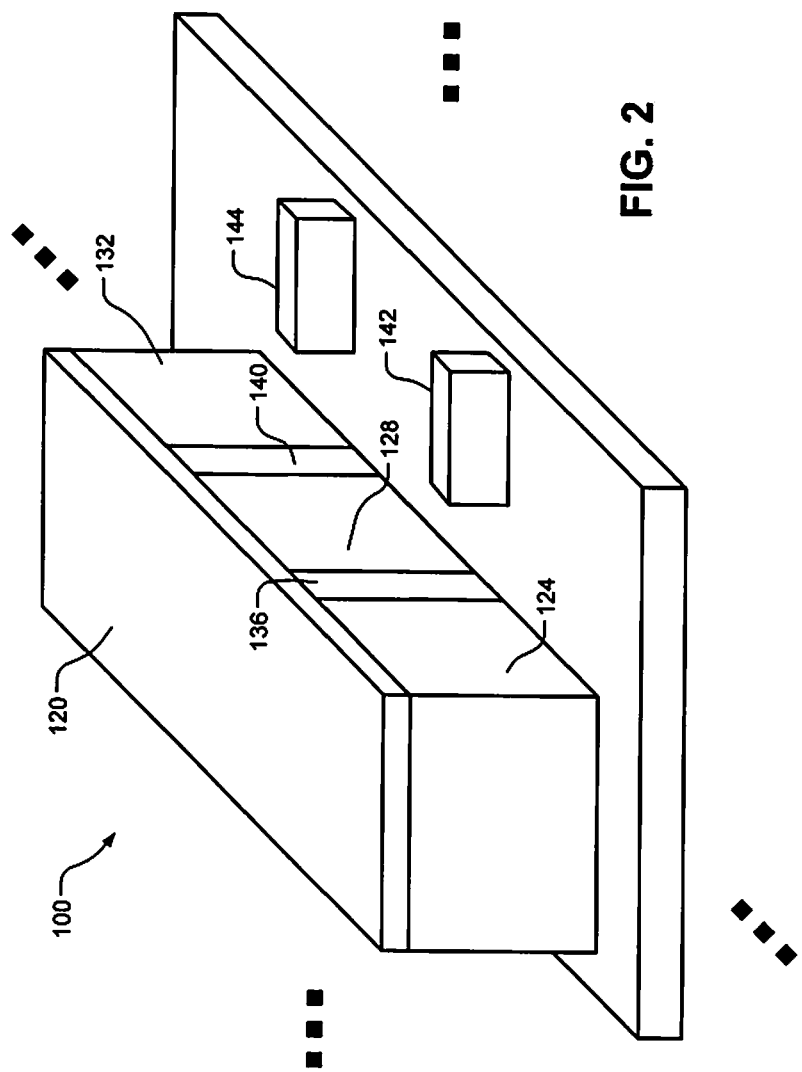
FIG. 2 is a perspective view of a substrate including silicon dummy structures.

Referring now to FIG. 2, a substrate 100 includes a hard mask layer 120. For example only, the hard mask layer 120 may include one or more silicon dioxide ($SiO_2$) or silicon nitride ($Si_3N_4$) structures, although other structures and/or materials may be used. One or more structures such as portions 124, 128 and 132 may be arranged under the hard mask layer 120. In some examples, the portions 124, 128 and 132 may be made of silicon dioxide ($SiO_2$) or silicon nitride ($Si_3N_4$). Silicon dummy structures 136 and 140 may also be arranged in covered areas between the portions 124, 128 and 132. In some examples, the dummy structures are made of pure silicon.

Silicon dummy structures 142 and 144 may also be arranged in uncovered areas. For example only, silicon dummy structures in uncovered areas may include dummy Si gate for high K metal gate transistors and mandrels for sidewall image transfer. In some processes, the silicon dummy structures 136, 140, 142 and 144 need to be removed from the substrate 100 without damaging other structures of the substrate 100. Furthermore, removal should be accomplished without leaving residue. To the extent that residue remains, it should be removable using solvents or other techniques that will not damage the remaining structures.

Figure 3:
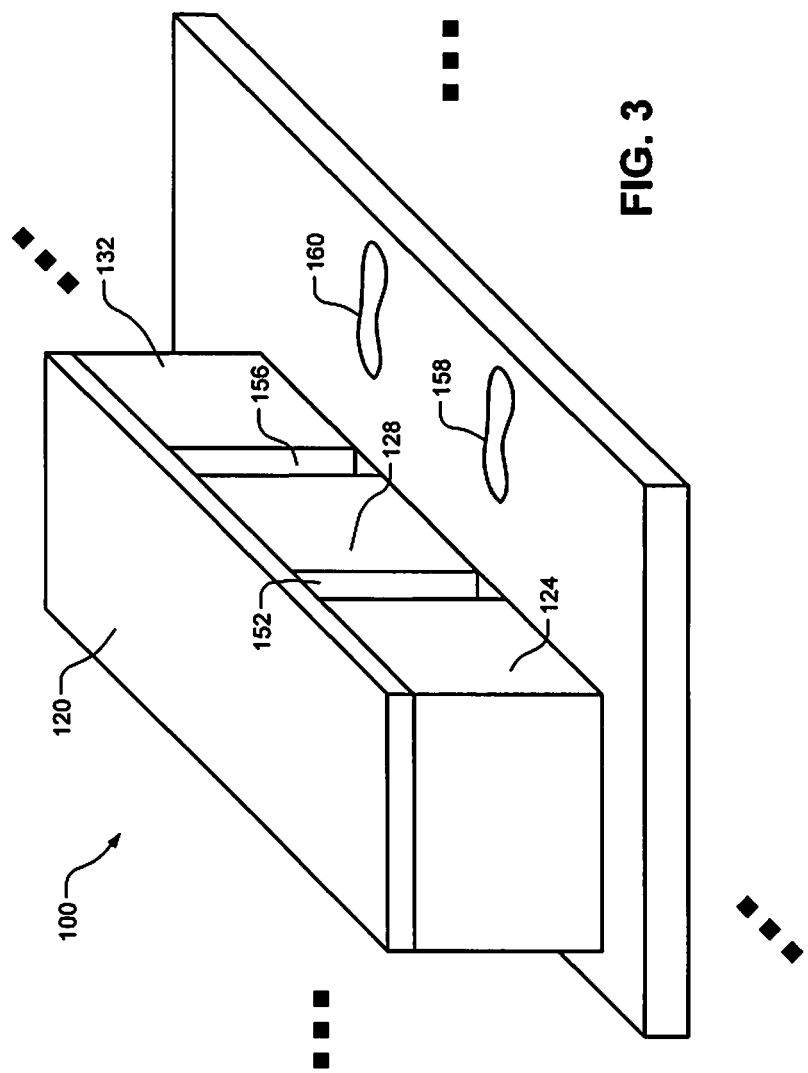
FIG. 3 is a perspective view of the substrate of FIG. 2 after removal of the silicon dummy structures.

Referring now to FIG. 3, a substrate 100 is shown after etching is performed in the ICP processing chamber. The silicon dummy structures 136, 140, 142 and 144 are removed using a highly selective etching process without leaving etch byproducts and little or no residue as can be seen at 152, 156, 158 and 160, respectively.

Figure 4:
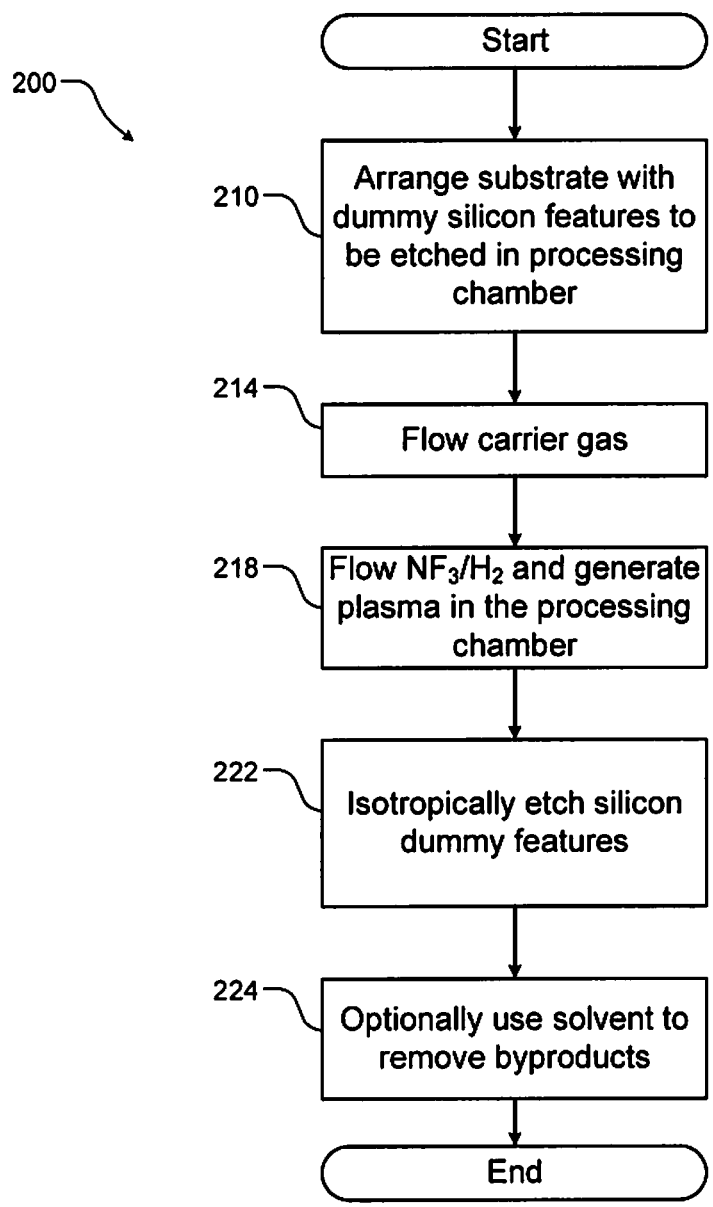
FIG. 4 is a flowchart illustrating a method for removing silicon dummy structures.

Referring now to FIG. 4, a method 200 for removing silicon dummy structures is shown. At 210, the substrate including one or more silicon dummy structures is arranged in a processing chamber. The dummy structures may be arranged in covered and/or uncovered regions. At 214, carrier gas is supplied to the processing chamber. In some examples, helium (He) or Argon (Ar) are used as the carrier gas, although other suitable carrier gases may be used.

At 218, plasma gas including $NF_3$ and $H_2$ are supplied to the processing chamber and plasma is ignited. At 222, the silicon dummy structures are isotropically etched by the plasma. At 224, solvent may be used if needed to remove byproducts without damage to $SiO_2$ or $Si_3N_4$.

In one example process, the vacuum gas pressure in the ICP processing chamber is set to 400 milliTorr (mT), although other pressures may be used. The inductively coupled power or source power is set to 550 W, although other power levels may be used. Argon and helium are used as carrier gases and both are supplied at 500 sccm, although other carrier gases and/or flow rates may be used. $H_2$ and $NF_3$ are supplied at 70 and 30 sccm, respectively, although other flow rates may be used. A pedestal bias voltage setpoint is set to 0V, although other bias voltages may be used. The temperature of the pedestal is set from an inner zone to an outer zone at 70° C., 70° C., 70° C. and 70° C., respectively, although other temperature settings may be used. The TCCT circuit may be set to 0.5, although other TCCT circuit settings may be used. The TCCT setting correlates to a power distribution between the inner and the outer coils. The higher the TCCT setting, the more power is forwarded towards the center coil; the lower the TCCT setting, the more power is forwarded to the outer coil. For example only, a gas injection ratio is set to equal (the gas injection ratio from the nozzle can be center, equal or edge).

In some examples, vacuum pressure >400 mT, a ratio of $NF_3/(NF_3+H_2) \leq 0.3$ and a temperature is >60 C.° C.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for etching a substrate, comprising:
arranging a substrate including a first structure and a dummy structure in a processing chamber,
wherein the first structure is made of a material selected from a group consisting of silicon dioxide and silicon nitride, and
wherein the dummy structure is made of silicon;
supplying carrier gas to the processing chamber;
supplying nitrogen trifluoride ($NF_3$) and molecular hydrogen ($H_2$) gas to the processing chamber, wherein the $H_2$ is supplied at a greater flow rate than the $NF_3$; and
striking plasma in the processing chamber in the presence of the supplied $NF_3$ and $H_2$ gas to perform an $NF_3/H_2$ plasma etch process to etch the dummy structure.

2. The method of claim 1, wherein the processing chamber is an inductively coupled plasma processing chamber.

3. The method of claim 1, wherein the dummy structure is covered by the material.

4. The method of claim 1, wherein the dummy structure is not covered by the material.

5. The method of claim 1, wherein the dummy structure is etched with etch byproducts.

6. The method of claim 5, further comprising removing the etch byproducts using a solvent.

7. The method of claim 6, wherein the solvent includes water.

8. The method of claim 6, wherein the solvent includes a mixture of sulfuric acid and hydrogen peroxide.

9. The method of claim 1, wherein the dummy structure is etched isotropically.

10. A method for etching a substrate, comprising:
arranging a substrate including a first structure and a dummy structure in a processing chamber,
wherein the first structure is made of a material selected from a group consisting of silicon dioxide and silicon nitride, and
wherein the dummy structure is made of silicon;
supplying carrier gas to the processing chamber;
supplying nitrogen trifluoride ($NF_3$) and molecular hydrogen ($H_2$) gas to the processing chamber;
striking plasma in the processing chamber; and
etching the dummy structure,
wherein a ratio of $NF_3/(NF_3+H_2)$ is less than or equal to 0.3.

* * * * *